US012566199B2

(12) United States Patent
Putz

(10) Patent No.: US 12,566,199 B2
(45) Date of Patent: Mar. 3, 2026

(54) METHOD AND DEVICE FOR MEASURING AN INSULATION RESISTANCE OF A DC VOLTAGE SOURCE CONNECTED TO A SPLIT INTERMEDIATE CIRCUIT IN MAINS PARALLEL OPERATION

(71) Applicant: SMA Solar Technology AG, Niestetal (DE)

(72) Inventor: Martin Putz, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 233 days.

(21) Appl. No.: 18/453,599

(22) Filed: Aug. 22, 2023

(65) Prior Publication Data

US 2023/0393179 A1      Dec. 7, 2023

Related U.S. Application Data

(63) Continuation of application No. PCT/EP2022/054253, filed on Feb. 21, 2022.

(30) Foreign Application Priority Data

Feb. 23, 2021    (DE) ..................... 10 2021 104 289.5

(51) Int. Cl.
 G01R 27/02      (2006.01)
 G01R 27/10      (2006.01)
 G01R 31/40      (2020.01)

(52) U.S. Cl.
 CPC ........... G01R 27/025 (2013.01); G01R 27/10 (2013.01); G01R 31/40 (2013.01)

(58) Field of Classification Search
 CPC ...... G01R 27/025; G01R 27/10; G01R 31/40; H02J 3/381; H02J 2300/24

USPC .................................... 324/120, 76.11, 76.34
 See application file for complete search history.

(56) References Cited

U.S. PATENT DOCUMENTS

| | | | | |
|---|---|---|---|---|
| 9,797,853 B2 * | 10/2017 | Mueller | ................. | G01R 27/16 |
| 11,909,353 B2 * | 2/2024 | Zeng | ........................ | H02J 3/381 |
| 2012/0014020 A1 | 1/2012 | Lehmann | | |
| 2012/0163048 A1 * | 6/2012 | Victor | ...................... | H02H 3/16 |
| | | | | 363/55 |

(Continued)

FOREIGN PATENT DOCUMENTS

| | | |
|---|---|---|
| DE | 102011051954 A1 | 1/2013 |
| DE | 102012104752 B3 | 11/2013 |

(Continued)

OTHER PUBLICATIONS

International Search Report dated Jun. 14, 2022 for International Application No. PCT/EP2022/054253.

*Primary Examiner* — Giovanni Astacio-Oquendo
(74) *Attorney, Agent, or Firm* — Eschweiler & Potashnik, LLC

(57)      ABSTRACT

To measure an insulation resistance of a DC voltage source connected to a split intermediate circuit, a midpoint potential of the DC voltage source is shifted by different operation of two voltage converters by way of which two poles of the DC voltage source are each connected to one of two parts of the split intermediate circuit. A change in a residual current across all lines that carry a current flowing across the intermediate circuit from the DC voltage source, resulting from the shifting of the midpoint potential of the DC voltage source, is measured.

23 Claims, 5 Drawing Sheets

(56) References Cited

U.S. PATENT DOCUMENTS

| | | |
|---|---|---|
| 2014/0306544 A1 | 10/2014 | Hantschel et al. |
| 2015/0084654 A1 | 3/2015 | Mueller |
| 2015/0185272 A1 | 7/2015 | Oberzaucher et al. |
| 2017/0302082 A1* | 10/2017 | Weng ..................... H02S 50/10 |
| 2021/0231735 A1 | 7/2021 | Aust et al. |
| 2022/0326294 A1* | 10/2022 | Wang ..................... G01R 31/14 |
| 2022/0373587 A1* | 11/2022 | Fischereder ........... G01R 15/04 |

FOREIGN PATENT DOCUMENTS

| | | |
|---|---|---|
| DE | 102013002018 A1 | 8/2014 |
| DE | 102013227174 A1 | 7/2015 |
| DE | 102018116055 B3 | 10/2019 |
| DE | 102018126235 A1 | 4/2020 |
| EP | 2230522 A1 | 9/2010 |
| WO | 2014079775 A1 | 5/2014 |

* cited by examiner

METHOD AND DEVICE FOR MEASURING AN INSULATION RESISTANCE OF A DC VOLTAGE SOURCE CONNECTED TO A SPLIT INTERMEDIATE CIRCUIT IN MAINS PARALLEL OPERATION

REFERENCE TO RELATED APPLICATIONS

This application is a Continuation of International Application number PCT/EP2022/054253 filed on Feb. 21, 2022, which claims the benefit of German Application number 10 2021 104 289.5, filed on Feb. 23, 2021. The contents of the above-referenced Patent Applications are hereby incorporated by reference in their entirety.

FIELD

The disclosure relates to a method for measuring an insulation resistance of a DC voltage source connected to a split intermediate circuit, and to a device for performing such a method.

BACKGROUND

A method for measuring an insulation resistance for an inverter and an inverter with a device for measuring an insulation resistance are known from DE 10 2012 104 752 B3. In the method and the device, a midpoint located between the switching elements of a half-bridge of the inverter is connected to a grounding point by closure of a ground switch. The midpoint connected to the grounding point is connected successively by means of the switching elements of the half-bridge to the two ungrounded poles of an intermediate circuit voltage of the inverter applied to the half-bridge, and the current flowing over this connection to the grounding point is measured. The known method and the device of the known inverter are not suitable for measuring the insulation resistance in a mains parallel operation of the inverter because they make use of the switching elements of the half-bridge of the inverter in a manner deviating from the use thereof in the mains parallel operation.

From DE 10 2018 126 235 A1 an insulation resistance measurement in an inverter is known, wherein the inverter has a DC voltage intermediate circuit and a bridge circuit connected to the DC voltage intermediate circuit for driving an alternating current over a bridge midpoint. The bridge midpoint is connected to a grounding point, and the bridge midpoint connected to the grounding point is connected successively by means of the bridge circuit to two voltage-differing points of the ungrounded DC voltage intermediate circuit. In this case, a current flowing from the two voltage-differing points to the grounding point is measured. The two voltage-differing points of the ungrounded DC voltage intermediate circuit are selected from a group of points such that the electrical voltages applied between the two voltage-differing points and ground do not exceed a predetermined limit value. The group of points from which this selection is made comprises, in addition to the two end points, at least one intermediate voltage point of the ungrounded DC voltage intermediate circuit. In this way, reliable insulation resistance measurement is made possible even when the DC voltage intermediate circuit is charged to an intermediate circuit voltage that significantly exceeds a nominal voltage rating of switching elements of the bridge circuit of the inverter and of hardware components of the measuring circuit. However, during operation of the inverter, especially in its mains parallel operation, even this known insulation resistance measurement is not possible.

From WO 2014/079775 A1, a method is known for measuring the insulation resistance of a DC voltage input of a running transformerless inverter that outputs an AC current at an AC voltage output with a predetermined ground reference, and of DC voltage sources connected to the DC voltage input relative to ground. In the known method, a periodic test voltage signal with a frequency lower than that of the AC current is generated relative to the predetermined ground reference of the AC voltage output in such a way that it is modulated onto the voltage at the DC voltage input when the inverter is running. A ground current caused by the test voltage signal is detected. The periodic test voltage signal is generated either by a separate voltage source between the AC voltage output of the inverter and its ground reference, or by the inverter itself relative to the ground reference of its alternating voltage output. In the latter case, the test voltage signal is generated by modifying control signals for an inverter bridge of the inverter. In each case, the test voltage signal has a frequency that is lower by at least a factor of 5, and often a factor of 10, than that of the AC current that the running inverter outputs at its AC output. The ground current caused by the test voltage signal is detected at the AC voltage output of the inverter as part of a summated current across the AC voltage output. The summated current is detected with a summation current transformer or by measuring the currents through individual lines and summating these currents. The insulation resistance can be determined from the test voltage signal and the summated current by additionally measuring a total voltage applied to the DC voltage input relative to ground. Although this known method can in principle be carried out in mains parallel operation, it nevertheless intervenes directly in the operation of the inverter, which is disruptive at least when the grid is formed with the inverter at the same time.

SUMMARY

The disclosure is directed to a method for measuring an insulation resistance of a DC voltage source connected to a split intermediate circuit, and a device for performing this method, which allow current to flow from the DC voltage source without interference to such an extent that an inverter connected to the intermediate circuit on the input side thereof can be used for uninterrupted grid forming of an AC network connected to its output.

In a method according to the disclosure for measuring an insulation resistance of a DC voltage source connected to a split intermediate circuit, a midpoint potential of the DC voltage source is shifted relative to a voltage midpoint of the split intermediate circuit between its two parts by different operation of two voltage converters, by way of which the DC voltage source is connected to one of two parts of the split intermediate circuit each. A change in a residual current resulting from the shift of the midpoint potential is detected across all lines carrying a current flowing from the DC voltage source across the intermediate circuit.

With the midpoint potential, every other electrical potential of the DC voltage source also shifts relative to the voltage midpoint of the intermediate circuit and therefore also relative to ground. Although a fixed ground reference of the intermediate circuit has an influence on the shift of the electrical potentials relative to ground, a fixed ground reference of the intermediate circuit is not a necessary condition for this shift to occur at all. On the other hand, the two poles of the DC voltage source may not have a direct ground reference when carrying out the method according to the disclosure.

In one embodiment, if a topology with two voltage converters, via which the DC voltage source is connected to one of two parts of a split intermediate circuit each, already exists, the method according to the disclosure can be carried out with little or no outlay on equipment.

Without further measures, the method according to the disclosure may lead to an asymmetry in the charging of the two parts of the split intermediate circuit; however, this asymmetry does not generally put into question a grid forming function of an inverter connected to the intermediate circuit on the input side thereof. Furthermore, it is not important for the method according to the disclosure for the two parts of the split intermediate circuit to be charged differently. Rather, in one embodiment the intermediate circuit can also be continuously balanced during the execution of the method according to the disclosure. For this purpose, differences between partial voltages that drop across the two parts of the split intermediate circuit can be actively compensated continuously, even during the different operation of the two voltage converters.

In one embodiment, the potential shift of the midpoint potential with respect to the voltage midpoint of the intermediate circuit resulting from the different operation of the two voltage converters is accompanied by an equally large potential shift relative to ground in case the ground reference of the voltage midpoint is fixed. The potential shift then directly corresponds to a voltage difference that is linked to the change in the residual current via the insulation resistance and therefore enables its detection. However, even without a fixed ground reference, a potential shift of the midpoint potential relative to ground is associated with the potential shift relative to the voltage midpoint of the intermediate circuit.

The resulting change in residual current can be detected at various points across all lines carrying the current flowing across the intermediate circuit from the DC voltage source. Here, "all lines" means a complete set of lines carrying the current flowing across the intermediate circuit from the DC voltage source. In one embodiment, these can be all output lines of the DC voltage source itself, or all output lines of the intermediate circuit, or all output lines of an inverter connected to the intermediate circuit on the input side, or even all lines at an intermediate or subsequent point.

To detect the voltage of the midpoint potential of the DC voltage source relative to the voltage midpoint of the intermediate circuit, voltages can be measured between the two poles of the voltage source and the voltage midpoint. The half difference of values of the two voltages is the voltage between the midpoint potential and the voltage midpoint of the intermediate circuit. In the execution of the method according to the disclosure, the potential shift of the midpoint potential resulting from the different operation of the two voltage converters is of interest. This can be detected as a change in half the difference of the values of the two voltages.

With a fixed ground reference of the intermediate circuit, and therefore, for example, with a grounded voltage midpoint of the intermediate circuit, the insulation resistance can be calculated as the quotient of the potential shift and the resulting change of the residual current. On the other hand, for an intermediate circuit in an IT (French: (solo Terre) network without a fixed ground reference, the quotient of the potential shift and the resulting change in the residual current results in a summated insulation resistance, as will be explained in more detail below.

To exclude influences of reactance components of the insulation resistance, the insulation resistance or the summated insulation resistance can also be calculated as a quotient of an integral of a square of an instantaneous value of the potential shift over a period of time over which the midpoint potential of the DC voltage source is shifted, and an integral of a product of the instantaneous value of the potential shift and an instantaneous value of the resulting change in the residual current over the same period of time. This corresponds to a formula with the insulation resistance Riso, the instantaneous value of the potential shift $u(t)$, the instantaneous value of the resulting change in the residual current $i(t)$ and the time period T: $R_{iso}=U^2/P$ where $U^2=1/T\int_{t_n}^{t_n+T}u^2(t)dt$ and $P=1/T\int_{t_n}^{t_n+T}u(t)\cdot i(t)dt$. In contrast to the verbal description, the factor $1/T$ that cancels down has been added with the duration T of the period over which the midpoint potential of the DC voltage source is shifted. U thus corresponds to the RMS value of the potential shift, and P corresponds to an effective power of the ground current resulting from the potential shift.

Alternatively, the insulation resistance or the summated insulation resistance can be calculated as the quotient of an integral of a product of the instantaneous value of the potential shift and an instantaneous value of the resulting change in the residual current over a period in which the midpoint potential of the DC voltage source is shifted, and an integral of a square of the instantaneous value of the resulting change in the residual current over the same period. In the form of a formula, this corresponds to $$R_{iso} = \frac{P}{I^2} \text{ where } P = \frac{1}{T}\int_{t_n}^{t_n+T} u(t)\cdot i(t)dt \text{ and } I^2 = \frac{1}{T}\int_{t_n}^{t_n+T} i^2(t)dt.$$

Here, I is the RMS value of the resulting change in the residual current.

In the intermediate circuit in an IT network, a voltage change of a ground voltage between the voltage midpoint of the intermediate circuit and ground resulting from the shift of the midpoint potential of the DC voltage source can additionally be detected, for which purpose this ground voltage is to be measured before and during the shift of the midpoint potential. The insulation resistance and an IT network insulation resistance, the sum of which is the summated insulation resistance, can then be determined from the relationship:

IT network insulation resistance/summated insulation resistance=voltage change/potential shift Here too, RMS values of the voltage change or potential shift, or corresponding integrals of instantaneous values of the voltage change and the potential shift over the same time period over which the midpoint potential of the DC voltage source is shifted, are, in one embodiment, used as the voltage change and potential shift.

In the case of the intermediate circuit in an IT network, the potential shift and the voltage change of the ground voltage between the voltage midpoint of the intermediate circuit and ground resulting from the shift of the midpoint potential of the DC voltage source can also be measured twice each; namely, once when a reference resistor of known resistivity is connected in parallel to an IT network insulation resistor, and once when the reference resistor is not connected in parallel to the IT network insulation resistor. The IT network insulation resistance and the insulation resistance that is of particular interest can then be determined from the summated insulation resistance by using the known value of the reference resistance.

In the method according to the disclosure, the midpoint potential for detecting the insulation resistance can be shifted by a constant value relative to the voltage midpoint of the intermediate circuit. However, the midpoint potential can also be shifted periodically and in one embodiment, sinusoidally. If an inverter is connected to the intermediate circuit on the input side thereof, it will then be advantageous for the midpoint potential to be periodically shifted with a period length that is at least 10 times or, for example, at least 100 times as long as a period length of an AC current output from the inverter. Influences of the alternating current on the determination of the insulation resistance are thereby avoided, as are non-compensable influences of the method according to the disclosure on the operation of the inverter.

It has already been mentioned that the insulation resistance can be detected with the method according to the disclosure in a mains parallel operation, for example, in the mains parallel operation of an inverter outputting an alternating current into an AC network. In doing so, the AC network to which the inverter is connected on the output side thereof can be supplied by the inverter. A reversal of the energy flow direction from the AC voltage source via the inverter is likewise possible. Even with such a reversed energy flow direction, the method according to the disclosure is feasible.

In a device according to the disclosure for carrying out the method according to the disclosure, comprising a split intermediate circuit having two parts and a voltage midpoint between the two parts, two input terminals for two poles of a DC voltage source, two voltage converters each connected on their respective input side to one of the two input terminals and on their respective output side to one of the two parts of the intermediate circuit, a control device for the two voltage converters, and a residual current detection device for detecting a residual current across all lines that carry a current flowing across the intermediate circuit from the DC voltage source, the control device is configured to shift, in an insulation resistance measuring mode, a midpoint potential of a DC voltage source connected to the input terminals relative to the voltage midpoint of the intermediate circuit by different operation of the two voltage converters, and the residual current detecting device is configured to detect a change in the residual current resulting from the shift of the midpoint potential of the DC voltage source. A plurality of DC voltage sources can also be connected to the two parts of the split intermediate circuit in each case via two separate voltage converters. Then, for each of these DC voltage sources, the method according to the disclosure can be carried out separately with the device according to the disclosure.

In one embodiment, the residual current detection device can be configured to detect the residual current across all lines between the input terminals and the intermediate circuit, and/or all output lines of the intermediate circuit, and/or all output lines of an inverter connected on the input side thereof to the intermediate circuit. The residual current detection device can have a summation current transformer. Alternatively, the residual current detection device can detect and summate the individual currents through the individual lines.

In one embodiment, the voltage measuring devices can be configured to measure voltages between the two input terminals and the voltage midpoint of the intermediate circuit.

In one embodiment, an intermediate circuit balancer of the device may be configured to equalize differences between two partial voltages that drop across the two parts of the split intermediate circuit.

In one embodiment, the voltage midpoint of the intermediate circuit can be grounded in order to provide a fixed ground reference of the intermediate circuit.

In one embodiment, the absence of a fixed ground reference of the intermediate circuit, a second voltage measuring device can be configured to measure a ground voltage between the voltage midpoint of the intermediate circuit and ground. Furthermore, a switch and a reference resistor of known resistivity can be connected in series between one of the voltage-carrying output lines, for example, one of the voltage-carrying output lines of an inverter connected to the intermediate circuit on the input side, and a ground terminal.

In one embodiment, an inverter of the device can be connected on the input side thereof to the intermediate circuit. This inverter can be configured to supply an AC network connected to it on the output side thereof. An inverter connected on the input side thereof to the intermediate circuit can also be a bidirectional power converter. The device can thereby be configured to connect a battery to an AC network.

Advantageous developments of the disclosure result from the claims, the description and the drawings.

The advantages of features and combinations of several features mentioned in the description are merely examples and may take effect alternatively or cumulatively without the advantages necessarily being achieved by embodiments according to the disclosure.

With regard to the disclosed content—not the scope of protection—of the original application documents and of the patent, the following applies: Additional features can be found in the drawings, in particular the shown geometries and the relative dimensions of several components to one another as well as their relative arrangement and operative connection. The combination of features of different embodiments of the disclosure or of features of different claims is also possible in deviation from the selected back-references in the claims and is hereby encouraged. This also applies to features that are shown in separate drawings or are mentioned in the description thereof. These features can also be combined with features of different claims. Likewise, features listed in the claims can be omitted for other embodiments of the disclosure, but this does not apply to the independent claims of the granted patent.

The features mentioned in the claims and the description are to be understood with respect to their number in such a way that exactly this number or a larger number than the number mentioned is present, without requiring an explicit use of the adverb "at least". If, for example, when a DC voltage source is the subject, it is to be understood that there is exactly one DC voltage source, two DC voltage sources, or more DC voltage sources. The features cited in the claims can be supplemented by additional features or can be the only features comprised by the respective method or the respective device.

The reference signs contained in the claims do not constitute a limitation of the scope of the subject-matter protected by the claims. They merely serve the purpose of making the claims easier to understand.

BRIEF DESCRIPTION OF THE FIGURES

The disclosure is further explained and described below with reference to preferred example embodiments illustrated in the figures.

DETAILED DESCRIPTION

The disclosure relates to a method for measuring an insulation resistance of a DC voltage source connected to a split intermediate circuit, and to a device for performing such a method.

The intermediate circuit can, for example, be an intermediate circuit at the input of an inverter via which the DC voltage source is connected to an AC network. The DC voltage source can be a battery that is connected to the AC network via a bidirectional inverter. Current can flow from the battery into the AC network and current can also flow from the AC network into the battery via the bidirectional inverter then. The DC voltage source can also be a photovoltaic generator to feed current unidirectionally into the AC network.

With each DC voltage source connected to a network, for monitoring function and safety it is important to regularly measure the insulation resistance of the DC voltage source. Of particular interest are methods that enable this measurement in a mains parallel operation, i.e., without a necessary interruption of the current flow between the DC voltage source and the power network. This is particularly true when an inverter via which the DC voltage source is connected to an AC network is provided as a grid-forming device for the AC network.

Figure 1:
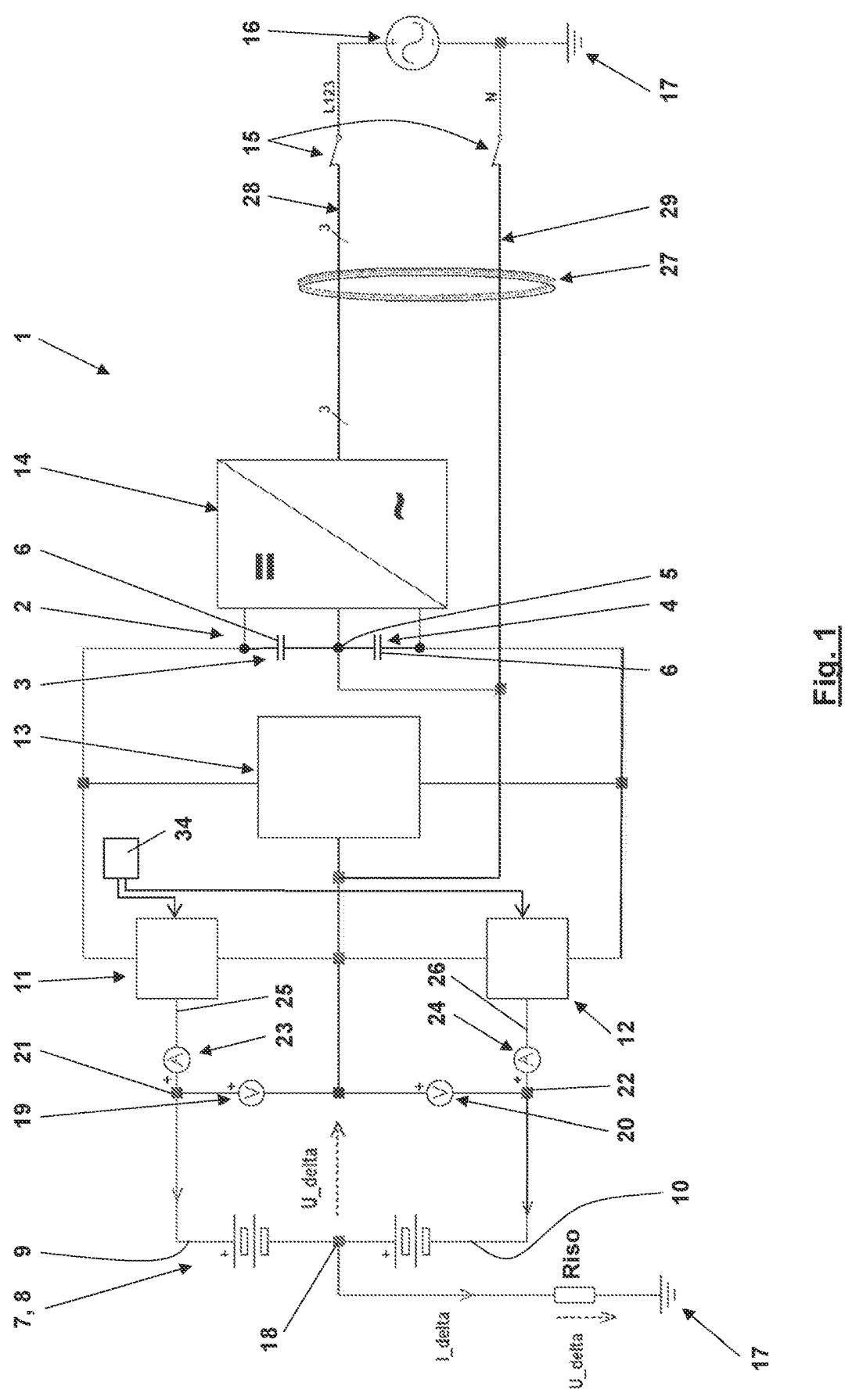
FIG. 1 shows a device according to the disclosure, comprising an inverter, connected to an external AC network with a grounded neutral conductor.

The device 1 shown in FIG. 1 has a split intermediate circuit 2 with two parts 3 and 4 and a voltage midpoint 5. The two parts 3 and 4 of the intermediate circuit 2 each have, in one embodiment, an equal capacitance, which is provided by at least one capacitor 6 each. A DC voltage source 7 is connected to the intermediate circuit 2, which in one embodiment is a battery 8. Specifically, each of the two differently named poles 9 and 10 of the DC voltage source 7 is connected to one of the two parts 3 and 4 of the intermediate circuit 2 via a voltage converter 11 and 12 respectively. In this case, the voltage converters 11 and 12 are each also connected to the voltage midpoint 5. Furthermore, an intermediate circuit balancer 13 is provided for the intermediate circuit 2, which continuously ensures an equal charging of the parts 3 and 4 and therefore equal voltages across the parts 3 and 4 of the intermediate circuit 2. An inverter 14 is connected on the input side thereof to the intermediate circuit 2. On the output side thereof, the inverter 14 is connected to an AC network 16 via a mains switch 15. Here, the voltage midpoint 5 is connected to ground 17 via a neutral conductor N of the AC network 16. In order to calculate an insulation resistance Riso of the DC voltage source 7 relative to ground 17, in an insulation resistance measurement mode of a control device 34 of the device 1, a midpoint potential of a potential midpoint 18 of the DC voltage source 7 is shifted with respect to the voltage midpoint 5 of the intermediate circuit 2, and therefore relative to ground 17, by different operation of the two voltage converters 11 and 12. A change I_delta of a residual current over all lines that carry a current flowing over the intermediate circuit 2 from the DC voltage source 7 that is associated with this potential shift U_delta, is detected. The insulation resistance Riso is then the quotient of U_delta and I_delta. Even though the insulation resistance Riso in FIG. 2 and in the following figures is sketched in by way of example at the potential midpoint 18 of the DC voltage source 7, an insulation fault and a resulting fault current via a finite insulation resistance Riso to ground can occur at any point between the two poles 9 and 10 of the DC voltage source 7. Independently of the location of its occurrence, the insulation fault or the resulting fault current is registered when the present disclosure is used. Since the potential of all points of the DC voltage source 7 in the insulation resistance measurement mode of the control device 34 is shifted to the same extent relative to the voltage midpoint 5 of the intermediate circuit 2 and therefore relative to ground 17, the actual spatial location has no influence on the determined insulation resistance Riso. For example, insulation faults may occur at several different locations of the DC voltage source 7, or an insulation fault may be spatially distributed over an area of the DC voltage source 7. However, both can be described by a spatially concentrated equivalent insulation resistance Riso, which can then be assumed to be at the potential midpoint 18 of the DC voltage source as shown in the figures. The present disclosure is therefore in no way limited to the measurement of the insulation resistance Riso at the location of the potential midpoint 18 of the DC voltage source.

In order to determine the potential shift U_delta, voltage measurement devices in the form of two voltmeters 19 and 20 are used in one embodiment to measure voltages between input terminals 21 and 22 of the device 1, to which poles 9 and 10 of the DC voltage source are connected, and the voltage midpoint 5. The potential shift U_delta resulting from different operation of the two voltage converters 11 and 12 then results as a change of a half difference of values of the two measured voltages. Two possibilities are indicated in FIG. 1 for determining the residual current or the change in the residual current resulting from the potential shift U_delta. First, ampere meters 23 and 24 are provided that measure the currents through lines 25 and 26 between the input terminals 21 and 22 and the voltage converters 11 and 12 that lead to parts 3 and 4 of the intermediate circuit 2. The residual current is the deviation from zero of the sum of these currents or of the difference in the values of these currents. Further, FIG. 1 shows a summation current transformer 27 that detects a sum of currents across all output lines 28 and 29 of the inverter 14 through which the inverter 14 is connected to the AC network 16. The summation current transformer 27 in one embodiment directly outputs the residual current whose change I_delta results from the potential shift U_delta.

In one embodiment, the insulation resistance Riso is determined as follows from a quotient of a square of the RMS value of U_delta and the active power of the current I_delta flowing across the insulation resistance Riso or of this active power and a square of the RMS value of the current I_delta, wherein a time period T of a multiple of the period length of the alternating current output by the inverter 14 is taken as a basis, and wherein u(t) and i(t) are the instantaneous values of U_delta and I_delta:

$$P = \frac{1}{T}\int_{t_n}^{t_n+T} u(t) \cdot i(t)dt$$

9

-continued $$U^2 = \frac{1}{T}\int_{t_n}^{t_n+T} u^2(t)dt \text{ or } I^2 = \frac{1}{T}\int_{t_n}^{t_n+T} i^2(t)dt$$

$$R_{iso} = \frac{U^2}{P} \text{ or } R_{iso} = \frac{P}{I^2}$$

The potential shift U_delta does not have to lead to a fixed value, but can also have a low-frequency sinusoidal waveform. The period length of this sinusoidal waveform is in one embodiment a multiple greater than the period length of the alternating current output by the inverter 14.

The different operation of the voltage converters 11 and 12 in order to induce the potential shift U_delta would in principle cause asymmetric charging of the intermediate circuit 2 across its two parts 3 and 4. However, this can be prevented by the intermediate circuit balancer 13 so that the operation of the inverter 14 is not affected by the measurement of the insulation resistance Riso while inducing the potential shift U_delta. In one embodiment, an uninterrupted mains parallel operation of the inverter 14 is possible, including an uninterrupted provision of the AC network 16 by the inverter 14.

Figure 2:
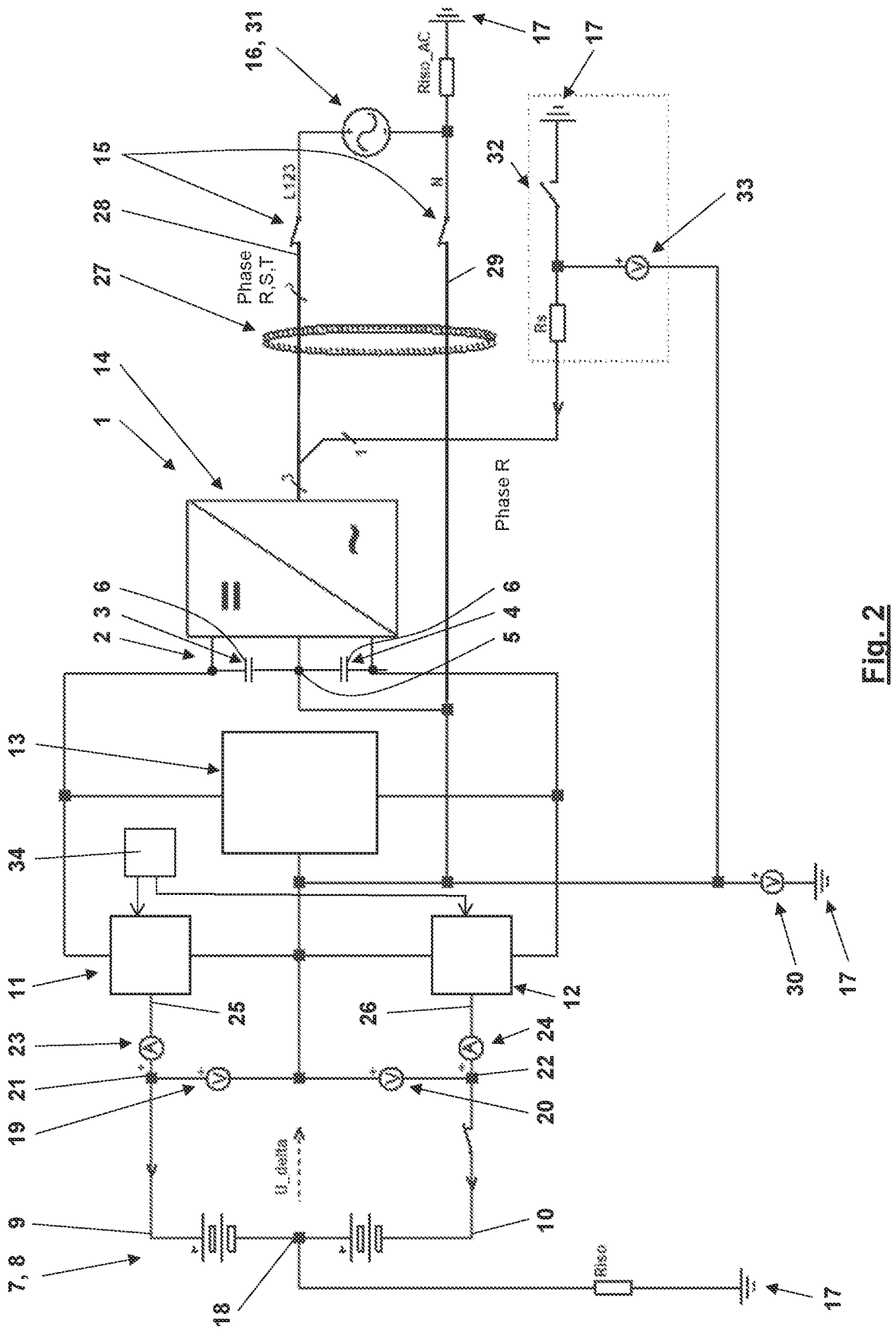
FIG. 2 shows a device according to the disclosure, comprising an inverter, connected to an IT network.

In the device according to FIG. 1, the intermediate circuit 2 has a fixed ground reference when the mains switch 15 is closed, in that the voltage midpoint 5 of the intermediate circuit 2 is grounded. This results in the potential shift U_delta occurring relative to ground. With an intermediate circuit 2 in an IT network without a ground reference, as shown in FIG. 2, the potential shift U_delta also leads to a shift of the potential of the voltage midpoint 5 relative to ground 17. This shift is detected according to FIG. 2 by measuring a ground voltage between the voltage midpoint 5 of the intermediate circuit 2 and ground 17 with a voltmeter 30. Otherwise, the device 1 according to FIG. 2, which is provided for connection to an IT network 31, i.e., to an AC network 16 without a fixed ground reference, differs by having a series connection of a reference resistor Rs of known resistivity and a switch 32 between one of the voltage-carrying output lines 28 of the inverter 14 and ground 17. A further voltmeter 33 shown in FIG. 2 is optional.

Figure 3:
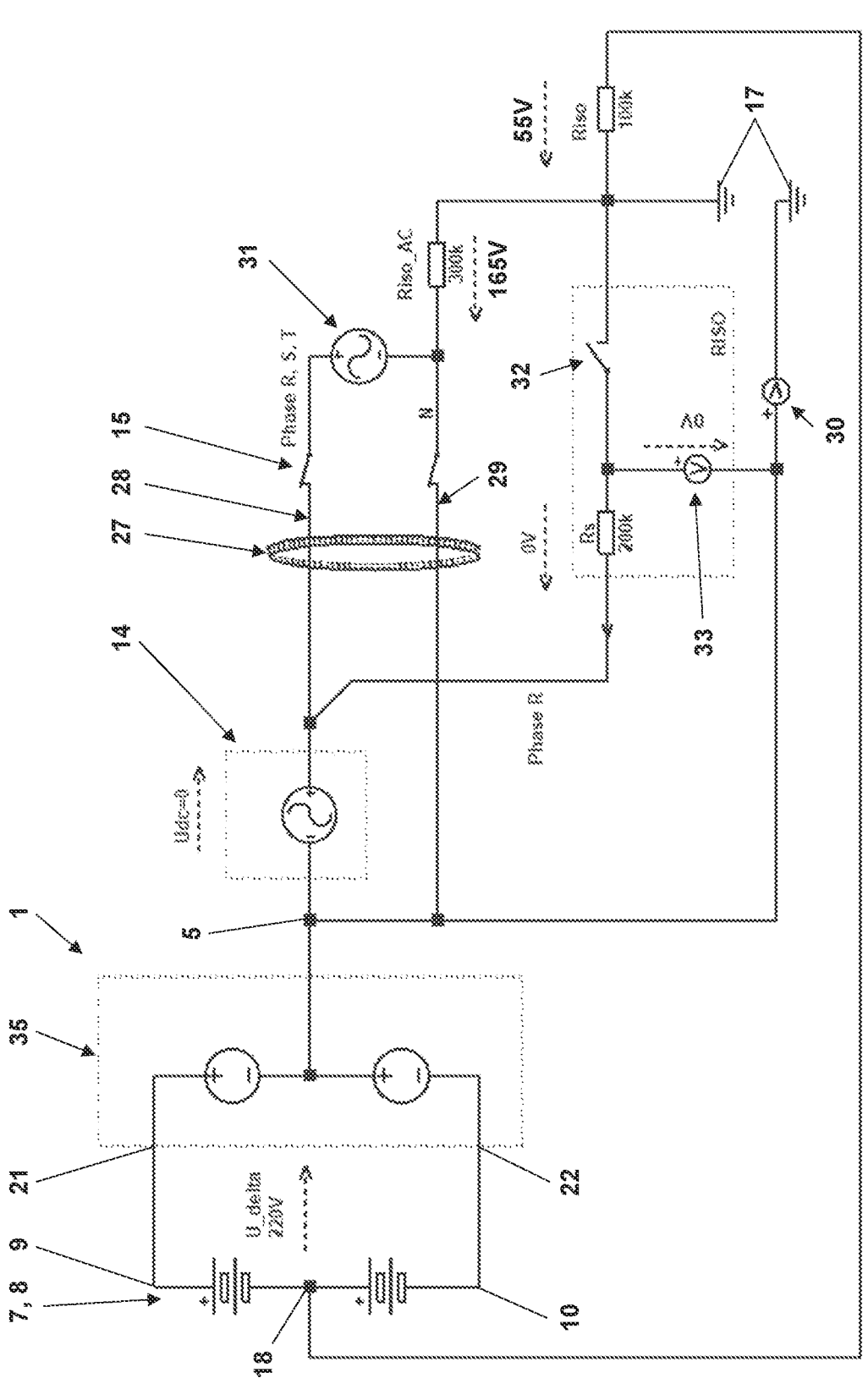
FIG. 3 is a first equivalent circuit diagram of the device according to FIG. 2 for the purpose of explaining the method according to the disclosure.

In the device 1 according to FIG. 2, the potential shift U_delta also results from the half difference of the values of the voltages measured with the voltmeters 19 and 20. When the switch 32 is open, the quotient of U_delta and the resulting change in the residual current detected with the ampere meters 23 and 24 or the residual current transformer 27 corresponds in this case to an insulation resistance sum of the insulation resistance Riso and an IT mains insulation resistance Riso_AC, whereby this quotient can be determined as above using effective values or the active power. This can be understood from FIG. 3, in which the intermediate circuit 2, the voltage converters 11 and 12 with the control device 34, the intermediate circuit balancer 13 and the voltmeters 19 and 20 of the device 1 are combined in a unit 35, and in which the inverter 14 is regarded as a short circuit on average over time. The potential shift U_delta of 220 V assumed here then drops depending on the value of the insulation resistance Riso of 100 kΩ assumed here and the mains insulation resistance Riso_AC of 300 kΩ assumed here in the indicated proportions of 55 V and 165 V across the insulation resistance Riso and the IT mains insulation resistance Riso_AC.

Figure 4:
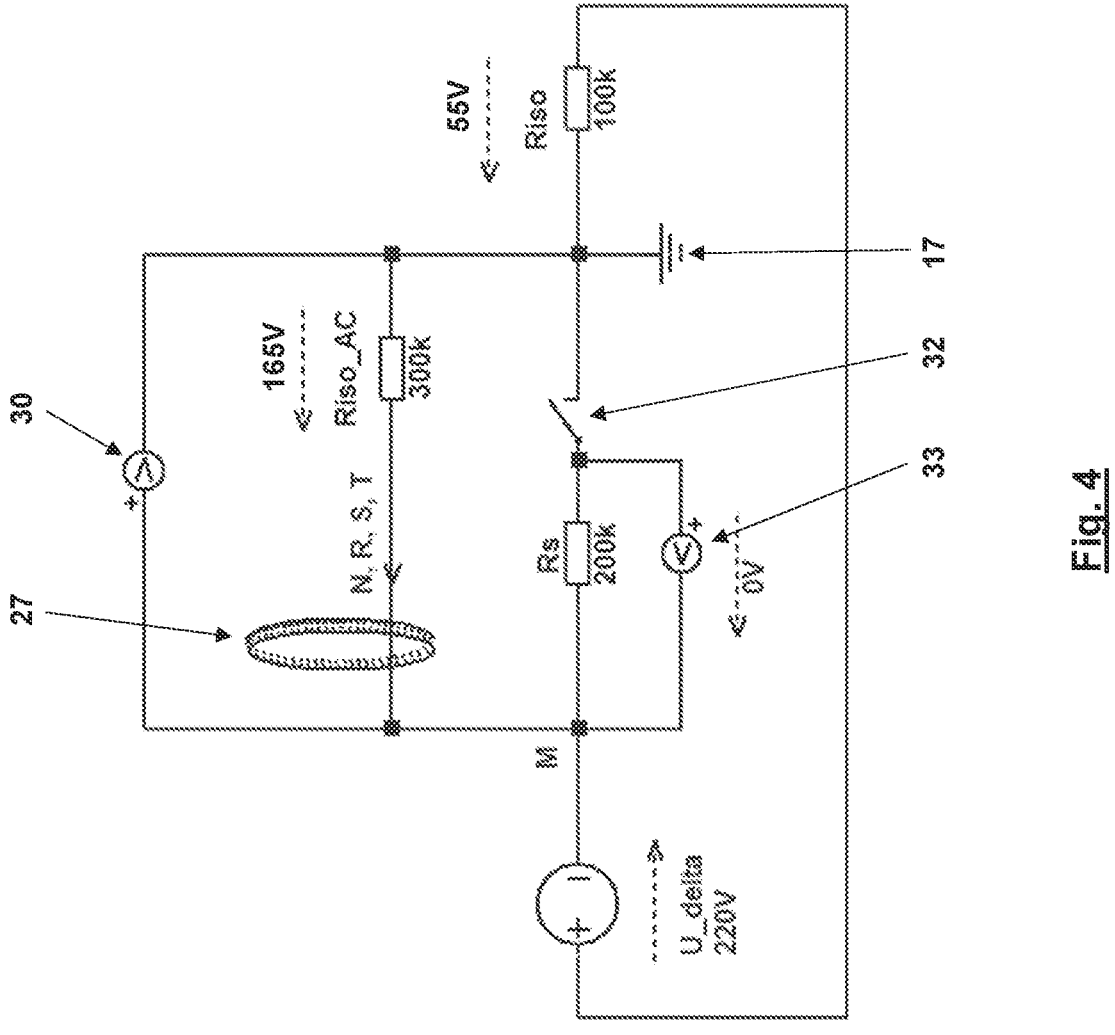
FIG. 4 shows a detail of FIG. 3, wherein a switch of the device leading to ground is open.

As can be seen from the illustration according to FIG. 4, by measuring the ground voltage with the voltmeter 30 when the switch 32 is open, the voltage drop across the IT mains

Figure 5:
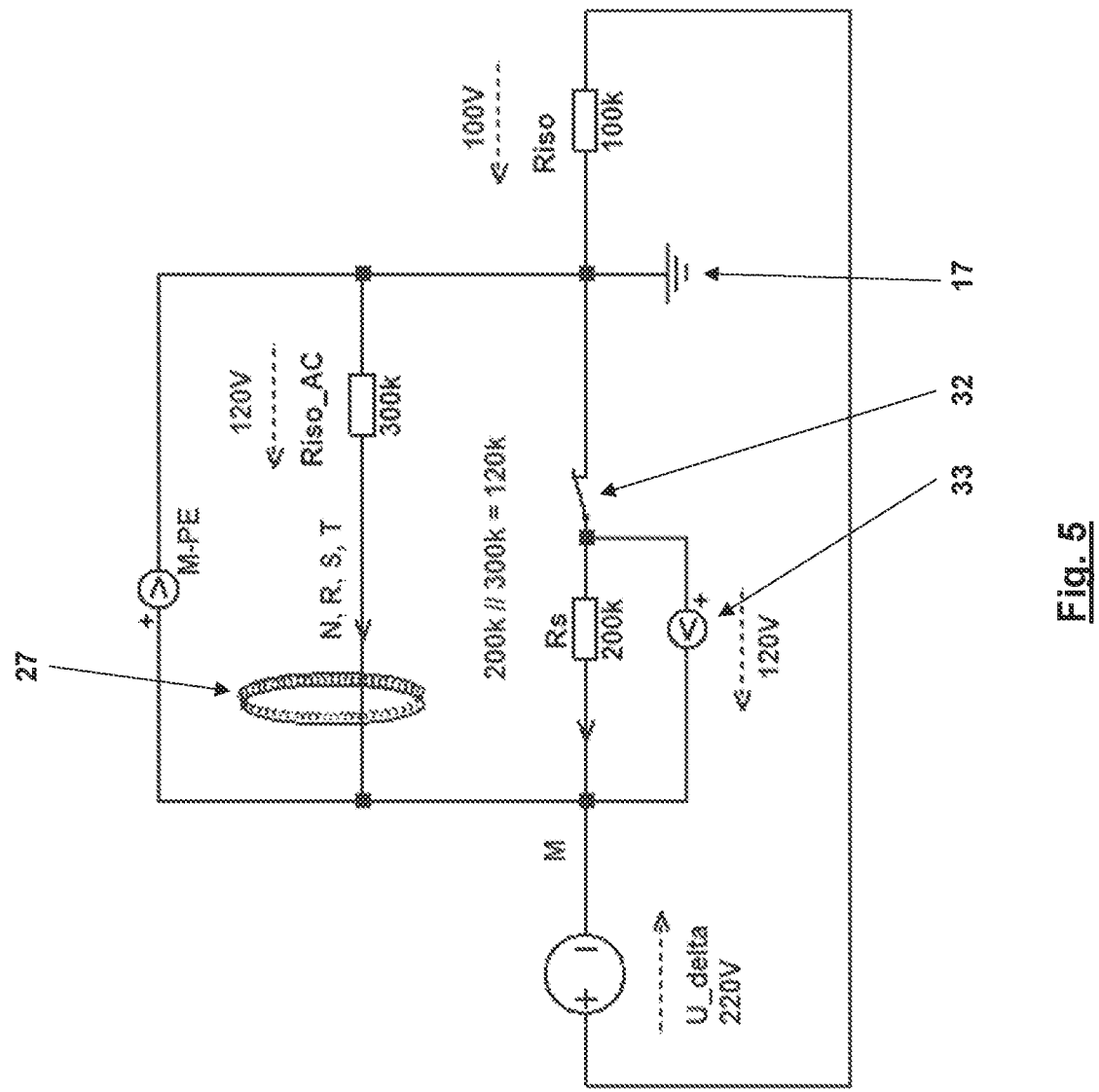
FIG. 5 shows the detail according to FIG. 4 with closed switch.

10 insulation resistance Riso_AC can be measured, and therefore the insulation resistance Riso can also be determined from the summated insulation resistance. In grounded systems, there is no mains insulation resistance, or in other words Riso_AC is very small, and accordingly only very little voltage drops across it. Accordingly, the summated insulation resistance here is essentially equal to the insulation resistance of the DC voltage source Riso. Conversely, if the IT mains insulation resistance Riso_AC is very high and the voltage drop across Riso_AC is correspondingly high, an accurate determination of Riso based solely on the ground voltage measured with the voltmeter 30 may be inaccurate. In this case, the switch 32 can be closed as shown in FIG. 5, whereby the reference resistance Rs of known resistivity, in this case 200 kθ, is connected in parallel with the mains insulation resistance Riso_AC. The voltage drop across Riso thereby increases here to 100 V and correspondingly the portion of the insulation resistance in the summated insulation resistance. Accordingly, by using the known reference resistance Rs, the insulation resistance of the DC voltage source 7 Riso can be determined even for an IT network 31 with a high mains insulation resistance Riso_AC without hard grounding of the IT system 31.

What is claimed is:

1. A method for measuring an insulation resistance (Riso) of a DC voltage source connected to a split intermediate circuit, comprising:
shifting a midpoint potential of the DC voltage source using a control circuit, and
measuring a change (I_delta) in a residual current across all lines that carry a current flowing across the split intermediate circuit from the DC voltage source resulting from the shifting of the midpoint potential of the DC voltage source using a residual current detection device,
wherein the midpoint potential of the DC voltage source is shifted by a different operation of two voltage converters in response to the control circuit by way of which two poles of the DC voltage source are respectively connected to a respective one of two parts of the split intermediate circuit, wherein the midpoint potential is shifted relative to a voltage midpoint of the split intermediate circuit between its two parts.

2. The method according to claim 1, wherein the residual current is measured across all output lines of the DC voltage source, and/or all output lines of the intermediate circuit, and/or all output lines of an inverter connected on an input side thereof to the intermediate circuit, and wherein the residual current is measured with a summation current transformer.

3. The method according to claim 1, further comprising:
measuring voltages between two poles of the DC voltage source and the voltage midpoint of the intermediate circuit using one or more voltage sensors, and
detecting a potential shift (U_delta) of the midpoint potential resulting from a different operation of the two voltage converters as a change of a half difference of values of the two voltages based on the measured voltages using the control circuit.

4. The method according to claim 3, further comprising, in the case of a fixed ground reference of the voltage midpoint of the intermediate circuit, calculating the insulation resistance (Riso) or, in the case of an intermediate circuit in an IT network, calculating a summated insulation resistance, as a quotient of the potential shift (U_delta) and a resulting change (I_delta) in the residual current.

5. The method according to claim 3, further comprising, in the case of a fixed ground reference of the voltage midpoint of the intermediate circuit, calculating, using the control circuit, the insulation resistance (Riso) or, in the case of an intermediate circuit in an IT network, calculating a summated insulation resistance as a quotient of:

an integral of a square of an instantaneous value of the potential shift over a time period over which the midpoint potential of the DC voltage source is shifted, and of an integral of a product of the instantaneous value of the potential shift and an instantaneous value of a resulting change in a differential current over the same time period, or an integral of a product of the instantaneous value of the potential shift and an instantaneous value of the resulting change in the residual current over the time period over which the midpoint potential of the DC voltage source is shifted, and an integral of a square of the instantaneous value of the resulting change in the residual current over the same time period.

6. The method according to claim 4, further comprising:

in the case of the intermediate circuit in an IT network, detecting a voltage change, using the one or more voltage sensors, resulting from the shift of the midpoint potential of the DC voltage source, of a ground voltage between the voltage midpoint of the intermediate circuit and a ground voltage, and determining, using the control circuit, the insulation resistance (Riso) and an IT network insulation resistance (Riso_AC) whose sum is the summated insulation resistance from:

IT network insulation resistance/summated insulation resistance=voltage change/potential shift, wherein RMS values of the voltage change and the potential shift or integrals of instantaneous values of the voltage change and the potential shift over a time period over which the midpoint potential of the DC voltage source is shifted are used as the voltage change and potential shift.

7. The method according to claim 4, further comprising:

in the case of the intermediate circuit in an IT network, measuring, twice each, the potential shift and a voltage change of a ground voltage between the voltage midpoint of the intermediate circuit and ground resulting from the shift of the midpoint potential of the DC voltage source, once when a reference resistor of known resistivity is connected in parallel to an IT network insulation resistor, and once when the reference resistor is not connected in parallel to the IT network insulation resistor.

8. The method according to claim 1, further comprising actively compensating differences between two partial voltages that drop across the two parts of the split intermediate circuit.

9. The method according to claim 1, further comprising connecting an inverter at an input side thereof to the intermediate circuit, and connecting the inverter at an output side thereof to an AC network.

10. The method according to claim 9, wherein the midpoint potential is shifted in a periodic manner, relative to the voltage midpoint of the intermediate circuit, with a period length that is at least 10 times as long as a period length of an AC current output from the inverter.

11. The method according to claim 9, wherein the insulation resistance is detected in a mains parallel operation of the inverter.

12. The method according to claim 9, wherein the AC network to which the inverter is connected on the output side thereof is supplied by the inverter.

13. The method according to claim 9, further comprising reversing an energy flow direction from the DC voltage source via the inverter.

14. A device, comprising:

a split intermediate circuit that comprises two parts, and a voltage midpoint between the two parts, two input terminals coupled to two poles, respectively, of a DC voltage source, two voltage converters, each connected on an input side thereof to a respective one of the two input terminals, and on an output side thereof to a respective one of the two parts of the intermediate circuit, a control device operably coupled to the two voltage converters, and a residual current detection device configured to detect a residual current across all lines that carry a current flowing across the intermediate circuit from the DC voltage source, wherein the control device is configured to shift, in an insulation resistance measuring mode, a midpoint potential of the DC voltage source connected to the input terminals relative to the voltage midpoint of the intermediate circuit by different operation of the two voltage converters, and wherein the residual current detection device is configured to detect a change in the residual current resulting from the shift of the midpoint potential of the DC voltage source.

15. The device according to claim 14, wherein the residual current detection device is configured to detect the differential current across all lines between the input terminals and the intermediate circuit, and/or all output lines of the intermediate circuit, and/or all output lines of an inverter of the device that is connected on the input side to the intermediate circuit, wherein the residual current detection device comprises a summation current transformer.

16. The device according to claim 14, further comprising first voltage measuring devices are configured to measure voltages between both input terminals and the voltage midpoint of the intermediate circuit.

17. The device according to claim 14, further comprising an intermediate circuit balancer configured to balance differences between two partial voltages that drop across the two parts of the split intermediate circuit.

18. The device according to claim 14, wherein the voltage midpoint of the intermediate circuit is grounded.

19. The device according to claim 14, further comprising a second voltage measuring device configured to measure a ground voltage between the voltage midpoint of the intermediate circuit and ground.

20. The device according to claim 19, further comprising a switch and a reference resistor of known resistivity connected together in series between one voltage-carrying output line of the device and a ground terminal.

21. The device according to claim 14, further comprising an inverter connected on an input side thereof to the intermediate circuit.

22. The device according to claim 21, wherein the inverter is configured to supply an AC network connected to an output side thereof.

23. The device according to claim 21, wherein the inverter comprises a bidirectional power converter.

* * * * *